United States Patent [19]

Akama et al.

[11] Patent Number: 5,595,858
[45] Date of Patent: Jan. 21, 1997

[54] MANUFACTURING METHOD FOR DOUBLE-SIDED WIRING BOARD

[75] Inventors: Fumio Akama, Ushiku; Yasuyuki Tanaka, Tsuchiura, both of Japan

[73] Assignee: Nippon Mektron, Ltd., Tokyo, Japan

[21] Appl. No.: 387,291

[22] Filed: Feb. 10, 1995

[30] Foreign Application Priority Data

Mar. 25, 1994 [JP] Japan .................. 6-079878

[51] Int. Cl.⁶ .................................. G03C 5/00
[52] U.S. Cl. .................. 430/314; 216/17; 216/18; 216/20; 430/313; 430/317; 430/318; 430/319
[58] Field of Search ........................... 430/312, 313, 430/314, 317, 318, 319; 216/18, 20

[56] References Cited

U.S. PATENT DOCUMENTS

| | | | |
|---|---|---|---|
| 3,956,043 | 5/1976 | Zahir et al. | 430/319 |
| 4,642,160 | 2/1987 | Burgess | 430/314 |
| 4,769,309 | 9/1988 | King et al. | 430/319 |
| 4,888,450 | 12/1989 | Lando et al. | 430/319 |
| 5,302,492 | 4/1994 | Ott et al. | 430/319 |
| 5,334,487 | 8/1994 | Kindl et al. | 430/314 |
| 5,352,325 | 10/1994 | Kato | 216/18 |

FOREIGN PATENT DOCUMENTS

| | | | |
|---|---|---|---|
| 3729733 | 3/1988 | Germany | 430/319 |
| WO88/04877 | 6/1988 | WIPO | 430/319 |

Primary Examiner—Glenn A. Caldarola
Assistant Examiner—J. Pasterczyk
Attorney, Agent, or Firm—Chilton, Alix & Van Kirk

[57] ABSTRACT

A photosensitive insulation bonding layer is formed on a conducting layer. The photosensitive insulation bonding layer is subjected to exposure treatment to produce an exposed area and an unexposed area. Another conducting layer is formed on the outer surface of the photosensitive insulation bonding layer which has undergone the exposure treatment, then both conducting layers are photoetched to produce desired wiring patterns. In the next step, the unexposed area is removed from the photosensitive insulation bonding layer by development so as to form an access opening for connecting a circuit component to the wiring patterns. Then, the exposed area of the photosensitive insulation bonding layer is turned into an insulating layer by curing.

5 Claims, 1 Drawing Sheet

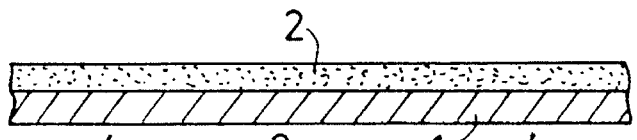
Fig. 1a
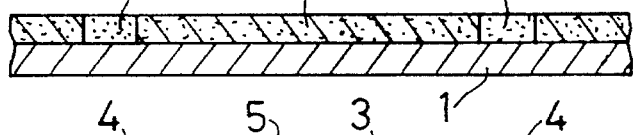
Fig. 1b
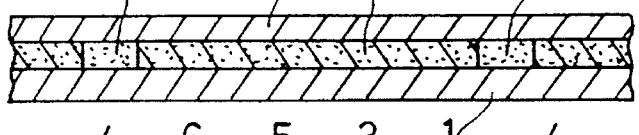
Fig. 1c
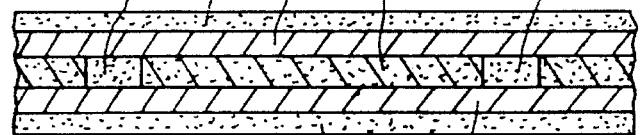
Fig. 1d
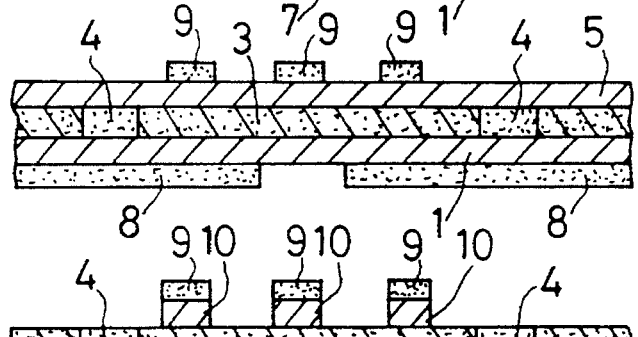
Fig. 1e
Fig. 1f
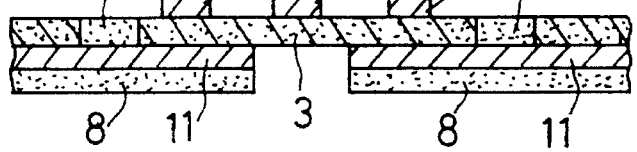
Fig. 1g
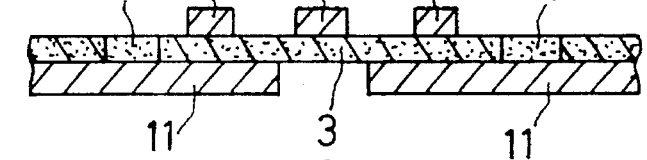
Fig. 1h
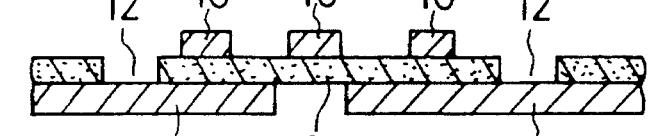
Fig. 1i
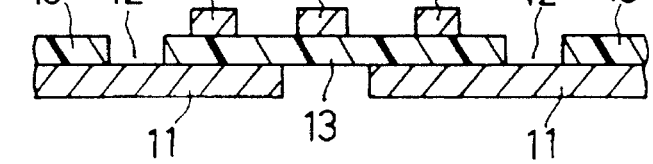

MANUFACTURING METHOD FOR DOUBLE-SIDED WIRING BOARD

BACKGROUND OF THE INVENTION

1. Field of the Invention

The present invention relates to a manufacturing method for a double-sided wiring board and, more particularly, to a technique for fabricating double-sided boards having at least a first access opening extending therethrough whereby circuit components on one side of such a board may be connected to a wiring pattern on the other side of the board.

2. Description of the Related Art

Double-sided circuit boards, i.e., electrical circuits with wiring patterns formed on the opposite surfaces of a resinous insulating layer, are well known and have many uses. In the use of such a double-sided circuit board, it is often necessary to provide access through the board from one side to the circuitry on the other side. Conventional methods of forming an access opening or through-hole in a double-sided circuit board, such an opening being used for example to connect a circuit component to a wiring pattern on at least one surface of the board, include laser machining, chemical etching and mechanical pre-punching of the insulating layer of the board.

The prepunching technique, however, requires that an opening be made beforehand by a punching means or the like in a predetermined position of an insulating layer and that the opening then be filled with a filler which can be removed in a later process. The filling of the punched opening is in the interest of facilitating the production of the wiring patterns. In addition, accurate alignment with the opening is required when producing the wiring patterns on both surfaces. These requirements lead to an extremely complicated process, placing various restrictions in manufacturing very fine, double-sided, flexible circuit boards.

As a technique for mass production, laser machining poses many problems, including high equipment cost, frequent maintenance required for maintaining optimum laser conditions at all times to ensure the best suited conditions for micromachining a resinous insulating layer, high operating cost for laser equipment, and the potential change in the insulating characteristic of the resinous insulating layer due to electrically conductive carbides which are liable to be formed at a laser machined section.

In the case of resin etching by chemical means, many resinous etchants contain materials which are extremely harmful to human bodies; therefore, a considerable amount of equipment cost is required to build a stable and safe manufacturing line wherein careful consideration is given to operation, maintenance, management, the disposal of waste liquids, etc.

SUMMARY OF THE INVENTION

It is an object of the present invention to provide a manufacturing method whereby an access openings may be provided through a double-sided circuit board, particularly a board having a resinous insulating layer, easily and without employing the conventional prepunching technique, laser machining, chemical etching, or the like stated above, thus enabling double-sided wiring boards having desired wiring patterns formed on both surfaces of a resinous insulating layer to be manufactured at low cost.

In accordance with the present invention, a photosensitive insulation bonding layer is formed on one surface of a first conducting layer, exposure treatment is carried out to produce a required exposed area(s) and a required unexposed area on the aforesaid photosensitive insulation bonding layer, and a second conductive layer is applied to the surface of the photosensitive insulation bonding layer, which has undergone the exposure treatment. One or both of the first and second conducting layers are photoetched to produce the desired wiring patterns on both surfaces of the photosensitive insulation bonding layer. Next, the unexposed area of the photosensitive insulation bonding layer is removed by development to thereby form an access opening through the insulation layer. Finally, the exposed area of the photosensitive insulation bonding layer is formed into an insulating layer by curing.

It is possible to practice the invention so that the wiring pattern produced from the second conducting layer is formed in the exposed area of the photosensitive insulation bonding layer and the wiring pattern produced by the first conducting layer is formed over the exposed and unexposed areas of the photosensitive insulation bonding layer.

BRIEF DESCRIPTION OF THE DRAWINGS

FIG. 1a through FIG. 1i show the manufacturing steps of an embodiment according to the present invention.

DETAILED DESCRIPTION OF THE PREFERRED EMBODIMENTS

FIG. 1a through FIG. 1i represent the process steps for manufacturing a double-sided wiring board according to an embodiment of the present invention. As illustrated in FIG. 1a, a first conducting layer 1 made of copper, aluminum, nickel, beryllium copper, or the like, layer one typically being approximately 25 μm to 50 μm thick, is prepared. A photosensitive insulation bonding layer 2, comprised of a polyimide, an epoxy resin, or the like, is uniformly produced on one surface of the conducting layer 1. The photosensitive insulation bonding layer 2 may be preformed into a film which is applied to, i.e., laminated with, the conductive layer 1.

As represented by FIG. 1b, the photosensitive insulation bonding layer 2 is exposed through a mask, the exposure treatment dividing the photosensitive insulation bonding layer 2 into exposed area 3 and unexposed areas 4. The exposed area 3 is an area where a wiring pattern, which is formed from the second conducting layer 5 in the manner to be discussed below, is formed. A wiring pattern formed from the first conducting layer 1 is disposed typically over the exposed areas 3 and the unexposed area 4.

In the next step, as shown in FIG. 1c, a second conducting layer 5 made of copper, aluminum, nickel, beryllium copper, or the like is applied over the photosensitive insulation bonding layer 2. As in the case of conducting layer 1, conducting layer 5 can be applied by laminating, without an adhesive agent, a conductive foil to the laminate comprising layers 1 and 2. Alternatively, conductive layer 5 may be produced by sputtering or by electroless plating.

Wiring patterns 10 and 11 are next formed on both surfaces of the photosensitive insulation bonding layer 1 by employing a photoetching procedure to selectively remove the conductive layers 1 and 5, such etching being a conventional procedure for the conducting layers 1 and 5 as shown in FIG. 1d through FIG. 1g.

More specifically, as illustrated in FIG. 1d, etching resists 7 and 6 are evenly laminated or properly formed by application or electro-deposition on the respective conductive layers 1 and 5. The etching resists 7 and 6 are then exposed through masks and developed as shown in FIG. 1e in order to produce resist patterns 8 and 9 commensurate with the desired wiring patterns. In the next step, as shown in FIG. 1f, conducting layers 1 and 5 are etched to separately form the desired wiring patterns 10 and 11. Removing the unnecessary resist patterns 8 and 9 in the following step as shown in FIG. 1g, completes the formation of the desired wiring patterns 10 and 11.

In the disclosed embodiment wiring pattern 10 is supported on a first surface of the exposed area 3 of the photosensitive insulation bonding layer. The wiring pattern 11 on the other surface of the three layer circuit board, however, extends over the second surfaces of the exposed area 3 and the unexposed area 4 of insulating layer 1.

After forming both wiring patterns 10 and 11, as shown in FIG. 1h, the photosensitive insulation bonding layer is developed and the unexposed areas 4 are removed, thereby producing access openings 12 for connecting circuit components on the same side of the board as pattern 10 to the wiring pattern 11 in the region of the access openings. Then, as illustrated in FIG. 1i, the exposed area 3 of the remaining photosensitive insulation bonding layer is subjected to curing to form area 3 into an insulating layer 13.

The aforesaid two wiring patterns 10 and 11 can be provided with surface protective layers as desired by adhesively securing insulating films over the conductors, by applying insulating ink, or by other similar means in accordance with a conventional procedure.

The processing steps described above permit easy continuous processing by adhesively securing together, for example, lengthy sheet materials in succession from one side so as to successively subject them to all the processing steps.

In the manufacturing method for double-sided wiring boards in accordance with the present invention, when producing desired wiring patterns on both surfaces of a resinous insulating layer, a photosensitive insulation bonding layer is employed as the resinous insulating layer. In the stage where the photosensitive insulation bonding layer has undergone the required exposure so as to produce an exposed area and unexposed areas, required wiring patterns are formed on both surfaces of the photosensitive insulation bonding layer, then the photosensitive insulation bonding layer is developed to remove the unexposed area. Lastly, the photosensitive insulation bonding layer is subjected to curing to be completed as an insulating layer. Thus, an access opening for connecting circuit components to a predetermined wiring pattern can be formed into an optional shape with high accuracy by removing the unexposed area from the photosensitive insulation bonding layer with a simple developing technique without the need of applying the conventional prepunching method or laser technique or resin etching method, which suffers from the shortcomings stated above, as a means for providing access openings.

Thus, the present invention permits highly accurate double-sided flexible circuit boards or the like, having access openings for connecting circuit components to predetermined wiring patterns to be produced at low cost.

What is claimed is:

1. A manufacturing method for producing a double-sided wiring board comprising the sequential performance of the steps of forming a photosensitive insulation bonding layer on one surface of a first conducting layer;

subjecting said photosensitive insulation bonding layer to exposure treatment so as to product an exposed area and at least a first unexposed area thereof;

forming a second conducting layer on the other surface of said photosensitive insulation bonding layer;

photoetching at least one of said first and second conducting layers to produce wiring patterns on at least one surface of said photosensitive insulation bonding layer;

removing the unexposed area of said photosensitive insulation bonding layer by development so as to form an access opening therethrough; and forming the exposed area of said photosensitive insulation bonding layer into an insulating layer by curing.

2. A manufacturing method for producing a double-sided wiring board according to claim 1, wherein the wiring pattern formed from said second conducting layer overlies the exposed area of said photosensitive insulation bonding layer.

3. A manufacturing method for producing a double-sided wiring board according to claim 1, wherein the wiring pattern formed from said first conducting layer overlies the exposed area and the unexposed area of said photosensitive insulation bonding layer.

4. A manufacturing method for producing a double-sided wiring board according to claim 2, wherein the wiring pattern formed from said first conducting layer overlies the exposed area and the unexposed area of said photosensitive insulation bonding layer.

5. A manufacturing method for producing a double-sided wiring board according to claim 1, wherein the step of forming a photosensitive insulation bonding layer on one surface of a first conducting layer comprises:

forming a film from a resin selected from the group consisting of epoxys and polymides; and laminating the said film to said first conducting layer.

* * * * *